United States Patent
Ems et al.

(10) Patent No.: US 7,285,946 B2
(45) Date of Patent: Oct. 23, 2007

(54) PATTERN TRIGGER IN A COHERENT TIMEBASE

(75) Inventors: Stephen C. Ems, Sloatsburg, NY (US); Simon Kreymerman, Suffern, NY (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

(21) Appl. No.: 11/346,653

(22) Filed: Feb. 3, 2006

(65) Prior Publication Data

US 2006/0176151 A1     Aug. 10, 2006

Related U.S. Application Data

(60) Provisional application No. 60/656,807, filed on Feb. 25, 2005, provisional application No. 60/650,985, filed on Feb. 7, 2005.

(51) Int. Cl.
*G01R 13/00* (2006.01)

(52) U.S. Cl. .............. 324/76.38; 324/76.62; 702/66

(58) Field of Classification Search ............ 324/76.38, 324/76.15, 76.16, 76.61, 76.62, 76.53
See application file for complete search history.

(56) References Cited

U.S. PATENT DOCUMENTS

| | | | | |
|---|---|---|---|---|
| 3,329,894 A | * | 7/1967 | Asbury et al. | ........... 324/76.33 |
| 3,876,946 A | | 4/1975 | LaClair et al. | |
| 4,471,452 A | * | 9/1984 | Borchert | ...................... 708/103 |
| 4,578,667 A | | 3/1986 | Hollister | |
| 4,704,691 A | * | 11/1987 | Blair | .......................... 702/124 |
| 4,791,404 A | * | 12/1988 | Hollister | ..................... 341/122 |
| 4,928,251 A | | 5/1990 | Marzalek et al. | |
| 5,162,723 A | | 11/1992 | Marzalek et al. | |
| 5,260,670 A | | 11/1993 | Ainsworth et al. | |
| 5,631,553 A | | 5/1997 | Bose et al. | |
| 5,701,421 A | * | 12/1997 | Miller et al. | ................. 710/305 |
| 5,708,432 A | | 1/1998 | Reynolds et al. | |
| 5,768,155 A | | 6/1998 | Becker | |
| 5,959,479 A | | 9/1999 | Woodward | |
| 5,978,742 A | * | 11/1999 | Pickerd | ....................... 702/66 |
| 6,181,267 B1 | | 1/2001 | MacDonald et al. | |
| 6,271,773 B1 | * | 8/2001 | Kobayashi | .................... 341/51 |
| 6,374,388 B1 | | 4/2002 | Hinch | |
| 6,700,516 B1 | * | 3/2004 | MacDonald | ................. 341/122 |
| 6,748,335 B2 | | 6/2004 | Pickerd | |
| 6,756,775 B2 | | 6/2004 | Jungerman | |
| 6,807,496 B2 | | 10/2004 | Pickerd | |
| 2003/0058970 A1 | * | 3/2003 | Hamre et al. | ................ 375/342 |
| 2006/0251200 A1 | * | 11/2006 | Miller | ......................... 375/371 |

OTHER PUBLICATIONS

"86107A Precision Timebase Reference Module", *Agilent Technologies*, OR, (2000-2005),9,11.

(Continued)

*Primary Examiner*—Anjan Deb
(74) *Attorney, Agent, or Firm*—Gordon Kessler

(57) ABSTRACT

A method and apparatus for acquiring a signal employing a coherent timebase are provided. The method comprises the steps of defining a pattern length count of a repetitive pattern in a signal to be acquired, defining a number of samples per unit interval, and providing data strobes synchronous to a coherent timebase. An arbitrary one of the data strobes is designated as a timing for a potential trigger. A number of subsequent data strobes is counted in accordance with the pattern length count times the samples per unit interval and a portion of the signal corresponding to the pattern length count times the samples per unit interval is acquired beginning at a point in the signal defined by the designated arbitrary data strobe. Thereafter one or more additional portions of the signal are acquired corresponding to the pattern length count times the samples per unit interval at a point in the signal defined by when the number of subsequent data strobes reaches the pattern length count times the samples per unit interval.

15 Claims, 4 Drawing Sheets

OTHER PUBLICATIONS

"Coherent Sampling vs. Window Sampling", *Maxim Integrated Products*, (2005),1-5.

"The Fundamentals of Mixed Signal Testing", *Soft Test*, Sampling chapter,6-1-6-32, Lab III-1-Lab III-16.

Coleman, Brendan, et al., "Coherent Sampling Helps when Specifying DSP A/D Converters", *EDN*, (Oct. 15, 1987),145-152.

Dethlefsen, Michael, et al., "Design Considerations in the Microwave Transition Analyzer", *Hewlett-Packard Journal*, (Oct. 1992),71.

Fibush, David K., et al., "A Guide to Digital Television Systems and Measurements", *Tektronix, Inc.* Oregon, (1997),1-49.

Hill, George, "The Benefits of Undersampling", *Electronic Design*, (Jul. 11, 1994),69-80.

Kecklider, Tom, "Careful Clocking Stops Leaks", *Evaluation Engineering*, (Nov. 2000),54-66.

Lauterbach, Michael, et al., "Capturing and Evaluating High-Frequency Signals", *LeCroy Corporation Evaluation Engineering*, (Jan. 2006),14-17.

Mahoney, Matthew, "DSP-Based Testing of Analog and Mized-Signal Circuits", *IEEE Computer Society Press*, Los Alamitos, CA, (1987),1-58, 249-257.

Miekle, Joseph A., "Frequency Domain Testing of ADCs", *IEEE Design & Test of Computers*, (Spring 1996),64-69.

Hill, George, "The Benefits of Undersampling", *Electronic Design*, 69-80 Jul. 11, 1994.

* cited by examiner

PATTERN TRIGGER IN A COHERENT TIMEBASE

CROSS REFERENCE TO RELATED APPLICATIONS

This application claims the benefit of U.S. Provisional Patent Application Ser. No. 60/650,985, entitled "Sampling Scope", filed Feb. 7, 2005, and U.S. Provisional Patent Application Ser. No. 60/656,807, entitled "Pattern Trigger in a Coherent Timebase", filed Feb. 25, 2005.

FIELD OF THE INVENTION

The present invention relates to a method and apparatus for providing a trigger in an acquisition system, such as that in an oscilloscope, including a coherent timebase.

BACKGROUND OF THE INVENTION

Traditionally, digital oscilloscopes capture, store and subsequently display representations of electronic signals. In order to acquire and store the data, the data must be acquired by an acquisition system. Typically, this acquisition is performed by defining a trigger position at a particular time, triggering at the particular time, sampling and digitizing an analog waveform at a predetermined time relative to the trigger, and storing the sampled, digitized data for a predetermined period of time after the trigger. In a sampling oscilloscope, the data input signal is typically at a frequency too fast for the acquisition system to acquire enough points sequentially to accurately represent the waveform. Therefore, as is shown in FIG. 1, in such an oscilloscope, if a repetitive waveform signal 110 is presented, one or more samples 150 are taken during each pass of the waveform. Thus, at the start of each waveform 110, one or more triggers 120 are defined, and data is sampled at a predefined delay (n, n+1) relative to each trigger, and stored, Thus, as is shown, on subsequently provided waveforms, a sampling point 130a, 130b, . . . progresses along the waveform. A sample 150 is taken at each sample point. By varying the delay between the trigger and the various sample points, over a number of the repetitive waveforms, data representing all portions of the waveform may be acquired and assembled, therefore presenting a single composite representation of the waveform.

However, in order to perform this type of acquisition, the waveform must be repetitive and stable. It must have a regular period and start at a substantially consistent time interval. If not, it is not possible to present a known delay to the sampling points after the start of the trigger, and therefore it would not be possible to insure that all desired data will be acquired.

A coherent timebase offers another method for acquiring samples from a repetitive waveform. A system for implementation of such a coherent timebase is shown in FIG. 2. A coherent timebase consists of a phase locked loop that synchronizes to an external trigger or clock and produces strobes that are applied to the sampler at the front end of the oscilloscope. The frequency of the phase locked loop does not precisely match that of the input signal (i.e. there is an offset), and therefore over time, various portions of the waveform are sampled. Eventually, after an amount of time in which all corresponding portions of the waveform are sampled, the locations of the samples in the waveform begin to repeat. The samples of the input waveform are taken at times corresponding to the strobe pulses, and the samples are then displayed on the oscilloscope screen based on a particular algorithm that puts the samples in the correct time order. Thus, the algorithm is aware when the sample corresponding to a particular strobe fits along the waveform, and is able to reconstruct the waveform by placing all of the samples in the correct timing relationship for the waveform.

In such a coherent timebase a trigger or clock must be available that is synchronous to the signal. This trigger or clock could be the signal itself, some clock derived from the signal, or a clock synchronously related to the signal. In FIG. 2, a clock signal 215 from a clock source 210 is used as a reference input to a Phase Locked Loop (PLL) 220. The PLL is programmed (via programming software commands 265 issued from a programming software 260) to provide an output strobe 225 that has a known frequency, which as noted above has a predetermined relationship to the frequency of the repetitive input signal. The output strobe drives a sampler 230 of the sampling scope. Samples 235 are acquired from a signal 245 generated from a signal source 240 successively at the strobe rate of the PLL, and therefore at predetermined locations along various waveforms of the repetitive waveform. After the required numbers of samples are acquired, they are processed by an algorithm that puts them in time order relative to the repetitive waveform. They are then displayed on a display 250 of an oscilloscope.

However, when utilizing a coherent timebase scheme to acquire samples from a waveform, a stable waveform may not be displayed on the screen because the strobe frequency generated by the PLL is offset from the frequency of the clock input. Successive acquisitions therefore have an arbitrary phase with respect to the previous acquisition so data points making up the waveform have a relative arbitrary time position on the screen. This may manifest itself in a waveform that appears to change position along the time axis on the display each time the display data is updated.

Therefore, it would be beneficial to be able to provide an improved acquisition and display system that works with a coherent timebase.

SUMMARY OF THE INVENTION

In accordance with the invention, an oscilloscope, such as a LeCroy® sampling digital oscilloscope, can accumulate multiple acquisitions and form a persistence map. This persistence map is a statistical view of the multiple data acquisitions accumulated by the oscilloscope. In order to accumulate these multiple acquisitions, a pattern trigger constructed in accordance with the invention allows one to trigger on any portion of a pattern down to the resolution of a particular sample. The timebase is set to a frequency offset from the input clock that provides samples of the input waveform at predetermined specified frequency, pattern length and samples per Unit Interval (UI). The timebase repeats the same sample after a time equal to the pattern length*samples per UI. A counter counting samples of length equal to the pattern length*samples per UI provides a trigger synchronized to the pattern length. A second counter started by the above trigger allows one to walk through the pattern length one sample at a time, rather than only allowing for bigger jumps through the data.

It is therefore an object of the invention to provide an improved method and apparatus for acquiring data.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combination(s) of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
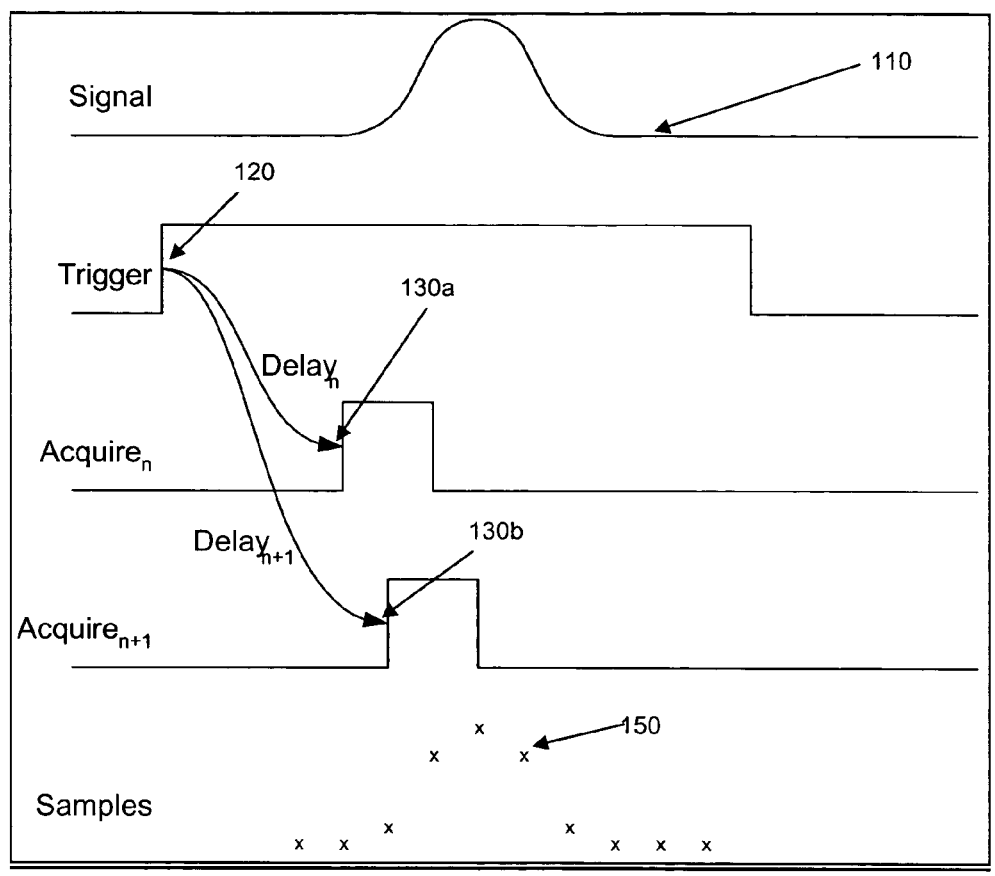
FIG. 1 is a first method for acquiring a signal.
Figure 2:
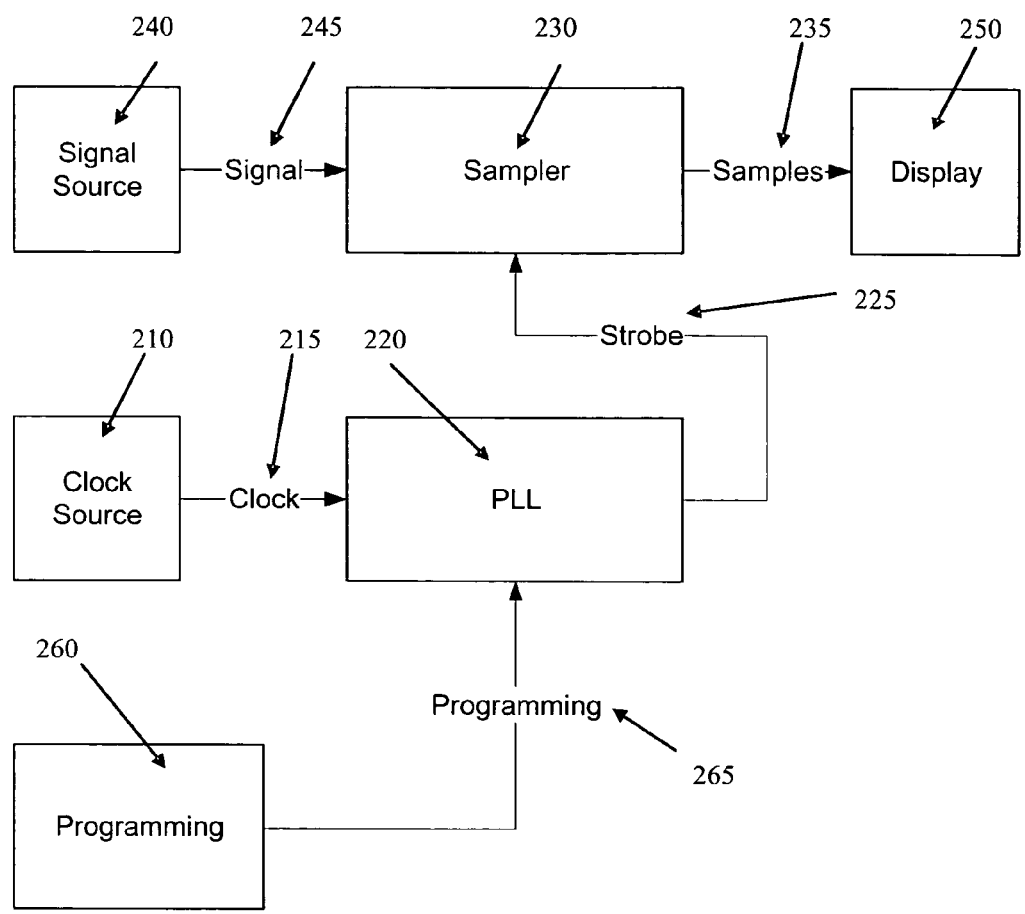
FIG. 2 is a block diagram representing a coherent timebase sampling apparatus.
Figure 3:
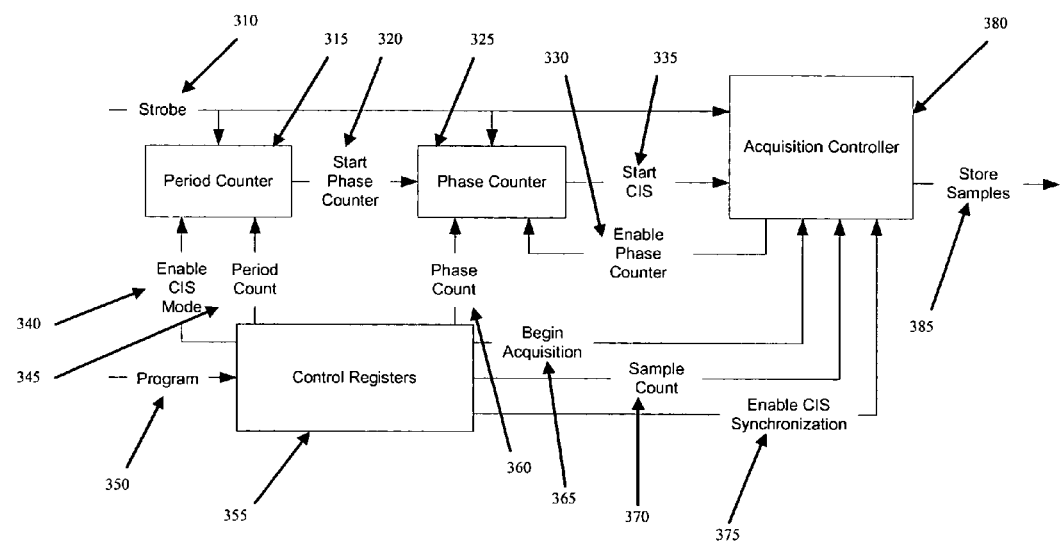
FIG. 3 is a detailed block diagram of the Coherent Interleaved Sampling (CIS) pattern synchronization implementation in accordance with the invention.

Referring next to FIG. 3, an apparatus implementing the present invention will be described. The CIS pattern sync apparatus of FIG. 3 fits into the system described above with reference to FIG. 2, in that the program input 350 is the same as the program input 260, the strobe received at 310 is produced by the PLL 220, and the output instruction 385 to store samples is received by the sampler 230 in FIG. 2. Thus, in accordance with the invention, the addition of the CIS pattern sync apparatus allows a user to synchronize the storage and display of a waveform so that portions of consecutive waveforms representing similar portions of a pattern are stored and displayed in their proper locations.

In order to produce a trigger which has a resolution of one sample synchronous to the pattern length, data strobes 310 produced by a coherent timebase are used for providing a timing for each sample that is to be taken of a waveform. These strobes are used along with a pre-set pattern length count (in terms of samples) to produce a periodic trigger synchronous to the periodicity of a user's input signal. This trigger is defined only by this pattern length and is independent of the data represented in the sampled waveform. This scheme allows for synchronization to a waveform at any single sample point along an arbitrarily specified pattern length independent of data content.

Each data strobe 310 is counted by a Coherent Interleaved Sampling (CIS) pattern synchronization logic portion of an acquisition controller 380. The acquisition controller is implemented in a Xilinx Field Programmable Gate Array (FPGA). A down counter, implemented as a period counter 315, is pre-loaded with a terminal count defining an upper limit of a counting interval, upon entering CIS mode. This CIS mode is enabled upon receipt by period counter 315 of an enable CIS mode signal 340 issued in accordance with a preset value stored in one of a plurality of control registers 355, which are in turn controlled by a software program 350. When CIS mode is entered, an arbitrary phase is established relative to an input data pattern length, and period counter 315 begins to count a user specified period count value 345 as provided from one of the plurality of control registers 355 for each data strobe. The period count value comprises a 40-bit value that is equal to a pattern length multiplied by a number of samples per unit interval. Each subsequent terminal count of this period counter (i.e. each time the terminal count value is reached by the counter) produces a potential trigger, indicated as a Start Phase Counter pulse 320. At the time the potential trigger is produced, if an enable phase counter signal 330 issued by acquisition controller 380 is present, then a second down counter, such as a phase counter 325 is loaded with and begins to count the 40-bit phase count value 360 noted above that was used to adjust the phase relative to the input data pattern length when entering CIS mode. The terminal count of this phase counter starts a CIS acquisition, indicated as a start CIS signal 335. Acquisition controller 380 produces appropriate signals to start and stop storage of data associated with each of the samples in the requested, for example, 23-bit sample count value 370. This count value may be as high as $2^{31}-1$, or higher. Here, if the enable CIS synchronization signal 375 is asserted based upon a value stored in one of the plurality of control registers 355, following each acquisition request (begin acquisition signal 365) an acquisition memory is initialized and then the enable phase counter signal 330 is asserted. The Phase Counter then starts counting samples at subsequent data strobes after the next potential trigger, its terminal count outputs a start CIS signal 335 to acquisition controller 380, and the first sample is taken and stored in acquisition memory.

This system therefore allows synchronization to the pattern length at any sample point along the pattern by adjusting the the Phase Count value 360. If the Coherent Interleaved Sampling pattern synchronization is disabled (i.e. the enable CIS synchronization 375 signal is not asserted) following each acquisition request the acquisition controller 380 will begin storage of data associated with each of the requested samples as soon as the acquisition memory is initialized at 385. As noted above, the control registers 355 store values that are used for driving the signals noted above, including enable CIS mode 340, enable CIS synchronization 375, begin acquisition 365, sample count 370, phase count 360 and period count 345) in response to direct register access via programming software commands 265 issued from a programming software 260 (see FIG. 2). The construction shown in FIG. 3, along with signals produced and stored therein, define the parameters and advance the progress of a CIS acquisition scheme as described in the flow chart shown in FIG. 4.

Figure 4:
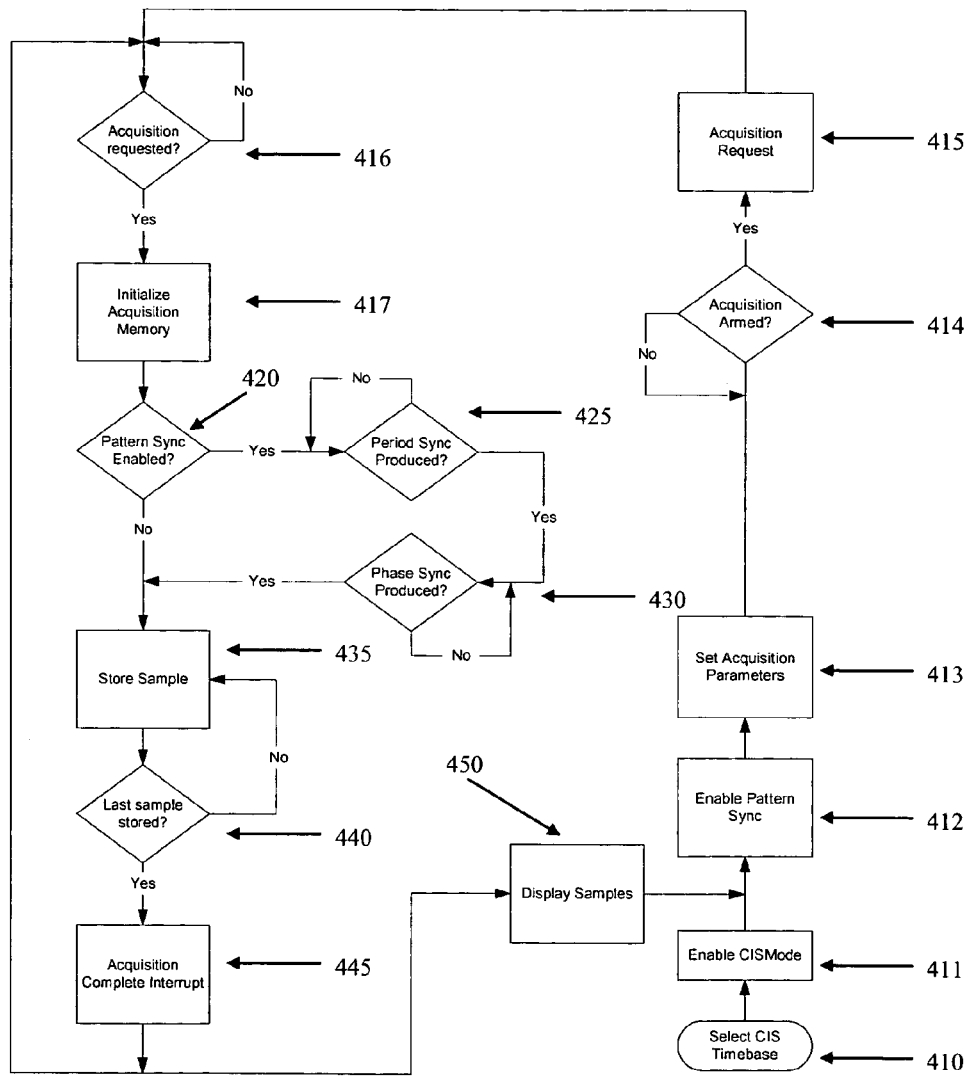
FIG. 4 is a flowchart that details the conditions involved in the progress of a Coherent Interleaved Sampling acquisition in accordance with the invention.

In FIG. 4, a user first selects that the CIS timebase along with pattern trigger are to be employed by the acquisition system at step 410. The computer program running the acquisition system first enables CIS mode 340 at step 411, enables pattern synchronization at step 412, and sets the required acquisition parameters for the implementation of the pattern trigger mode at step 413, including period count value 345, phase count value 360 and sample count value 370. Next, if the user has not armed the acquisition, the system (software and acquisition controller) waits for a request from the user to arm the system at step 414. At step 415, after being armed, an acquisition is requested by the user, or by the software running the system at step 416. If an acquisition is requested, the acquisition controller 380 then initializes the acquisition memory at step 417. If pattern synchronization is enabled for the particular upcoming acquisition at step 420, the controller waits for period synchronization to the desired pattern periodicity (arbitrary phase) at step 425, followed by synchronization to the desired pattern phase (defined by the timebase delay setting) at step 430. The acquisition controller 380 will then start storage of the sample data at step 435 to acquisition memory. When the requested sample count 370 is reached and the last data is stored at step 440, data will stop being stored to memory and the computer program will be alerted that the storage of the data has been completed at step 445. The acquired sampled data will then be read from acquisition memory and displayed at step 450. This process will be repeated as long as the CIS timebase is selected, and the computer program running the acquisition system exercises the pattern synchronization option and redefines the required parameters for the implementation of the pattern trigger mode as necessary in response to user input.

The advantages of this implementation is that the resolution for scrolling along the input data stream is a single sample and is not dependent on the samples per UI setting.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method for acquiring a signal employing a coherent timebase, comprising the steps of:
   defining a pattern length count of a repetitive pattern in a signal to be acquired;
   defining a number of samples per unit interval;
   providing data strobes synchronous to a coherent timebase;
   designating an arbitrary one of the data strobes as a timing for a potential trigger;
   counting a number of subsequent data strobes in accordance with the pattern length count times the samples per unit interval;
   acquiring a portion of the signal corresponding to the pattern length count times the samples per unit interval, beginning at a point in the signal defined by the designated arbitrary data strobe; and
   acquiring one or more additional portions of the signal corresponding to the pattern length count times the samples per unit interval at a point in the signal defined by when the number of subsequent data strobes reaches the pattern length count times the samples per unit interval.

2. The method of claim 1, wherein a counter for storing the data strobe counting is reset to zero each time it reaches the pattern length count times the samples per unit interval.

3. The method of claim 2, wherein each time the counter reaches the pattern length count, a potential trigger is defined.

4. The method of claim 3, wherein a portion of the signal is acquired when a potential trigger is reached, and an additional designation to acquire a signal is present.

5. The method of claim 4, wherein the additional designation is input by a user.

6. The method of claim 1, wherein the additional portions of the signal are offset to the first portions in accordance with a delay set by a phase counter from the point in the signal defined by when the number of subsequent data strobes reaches the pattern length count times the samples per unit interval.

7. The method of claim 1, wherein the portions of the signal acquired include digitized samples.

8. The method of claim 7, wherein the digital samples acquired from the initial portion and the subsequent portions of the signal are interleaved.

9. An apparatus for acquiring a signal employing a coherent timebase, comprising:
   a memory for storing a pattern length count times the samples per unit interval of a repetitive pattern in a signal to be acquired;
   a strobe generator for providing strobes synchronous to a coherent timebase;
   a controller for designating an arbitrary one of the data strobes as a timing for a potential trigger, and for counting a number of subsequent data strobes in accordance with the pattern length count times the samples per unit interval;
   a signal acquisition module for acquiring a portion of the signal corresponding to the pattern length count times the samples per unit interval, beginning at a point in the signal defined by the designated arbitrary data strobe, and for acquiring one or more additional portions of the signal corresponding to the pattern length count times the samples per unit interval at a point in the signal defined by when the number of subsequent data strobes reaches the pattern length count times the samples per unit interval.

10. The apparatus of claim 9, wherein the signal acquisition module acquires a portion of the signal each time the number of data strobes and subsequent data strobes reaches the pattern length count times the samples per unit interval.

11. The apparatus of claim 9, wherein each time the controller counts data strobes up to the pattern length count times the samples per unit interval, a potential trigger is defined.

12. The apparatus of claim 11, further comprising a trigger enable signal, wherein a portion of the signal is acquired when a potential trigger is reached, and the trigger enable signal is present.

13. The apparatus of claim 12, wherein the trigger enable signal is input by a user.

14. The apparatus of claim 9, wherein the portions of the signal acquired include digital samples.

15. The apparatus of claim 14, wherein the digital samples acquired from the portion portions of the signal are interleaved.

* * * * *